US 011778754B2

(12) United States Patent
Zhang et al.

(10) Patent No.: US 11,778,754 B2
(45) Date of Patent: Oct. 3, 2023

(54) COMPONENT CARRIER WITH THROUGH HOLE FILLED WITH EXTRA PLATING STRUCTURE BETWEEN SIDEWALLS AND PLATED BRIDGE STRUCTURE

(71) Applicant: AT&S Austria Technologie & Systemtechnik Aktiengesellschaft, Leoben (AT)

(72) Inventors: Robin Zhang, Nanjing (CN); Seok Kim Tay, Singapore (SG)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 413 days.

(21) Appl. No.: 16/777,116

(22) Filed: Jan. 30, 2020

(65) Prior Publication Data

US 2020/0253062 A1 Aug. 6, 2020

(30) Foreign Application Priority Data

Jan. 31, 2019 (CN) .......................... 201910101356.7

(51) Int. Cl.
*H05K 3/42* (2006.01)
*H05K 1/18* (2006.01)
*H05K 1/11* (2006.01)

(52) U.S. Cl.
CPC ............. *H05K 3/429* (2013.01); *H05K 1/115* (2013.01); *H05K 1/186* (2013.01); *H05K 3/423* (2013.01);
(Continued)

(58) Field of Classification Search
CPC ........ H05K 3/423; H05K 1/186; H05K 1/115; H05K 3/429; H05K 1/11; H05K 1/18; H05K 3/42
(Continued)

(56) References Cited

U.S. PATENT DOCUMENTS 8,431,833 B2 * 4/2013 Kajihara .............. H05K 3/0032
174/265
10,827,622 B2 * 11/2020 Nakamura ........... H05K 3/4682
(Continued)

FOREIGN PATENT DOCUMENTS

CN 106961806 A 7/2017

OTHER PUBLICATIONS

Nishimura, Japanese Patent Publication No. 2016-157901, Sep. 1, 2016 (Year: 2016).*
(Continued)

*Primary Examiner* — Tremesha S Willis
(74) *Attorney, Agent, or Firm* — Robert A. Blaha; Smith Tempel Blaha LLC

(57) ABSTRACT

A component carrier includes an electrically insulating layer structure with a first main surface and a second main surface, a through hole extends through the electrically insulating layer structure between the first main surface and the second main surface. The through hole has a first tapering portion extending from the first main surface and a second tapering portion extending from the second main surface. The through hole is delimited by a first plating structure on at least part of the sidewalls of the electrically insulating layer structure and a second plating structure formed separately from and arranged on the first plating structure. The second plating structure includes an electrically conductive bridge structure connecting the opposing sidewalls.

19 Claims, 2 Drawing Sheets

(52) U.S. Cl.
CPC ............... *H05K 2201/0959* (2013.01); *H05K 2201/09827* (2013.01); *H05K 2203/1572* (2013.01)

(58) Field of Classification Search
USPC .......................................................... 361/748
See application file for complete search history.

(56) References Cited

U.S. PATENT DOCUMENTS

| | | |
|---|---|---|
| 2006/0021794 A1 | 2/2006 | Cheng |
| 2014/0154463 A1 | 6/2014 | Liang |
| 2016/0042861 A1* | 2/2016 | Mano .................. H01F 27/245 336/200 |
| 2019/0124768 A1* | 4/2019 | Adachi ................. H05K 3/429 |

OTHER PUBLICATIONS

Office Action in China Patent Application No. 201910101356.7; pp. 1-8; dated Sep. 30, 2022; China National Intellectual Property Administration; No. 6, Xitucheng Lu, Jimenqiao Haidian District, 100088; Beijing City; China.

English translation of cover pages of Office Action in China Patent Application No. 201910101356.7; pp. 1-3; dated Sep. 30, 2022; China National Intellectual Property Administration; No. 6, Xitucheng Lu, Jimenqiao Haidian District, 100088; Beijing City; China.

* cited by examiner

COMPONENT CARRIER WITH THROUGH HOLE FILLED WITH EXTRA PLATING STRUCTURE BETWEEN SIDEWALLS AND PLATED BRIDGE STRUCTURE

CROSS-REFERENCE TO RELATED APPLICATION

This application claims priority to Chinese Patent Application No. 201910101356.7 filed Jan. 31, 2019, the disclosure of which is hereby incorporated herein by reference.

TECHNICAL FIELD

Embodiments of the invention relate to a component carrier and a method of manufacturing a component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions. All these requirements go hand in hand with a continued miniaturization of component carriers and their constituents.

Moreover, it may be advantageous to efficiently contact electrically conductive layer structures and/or components embedded in a component carrier with proper quality. Formation of mechanical vias and laser vias, which may be copper filled, may be advantageous for this and other purposes.

SUMMARY

There may be a need to manufacture a component carrier with proper electric reliability.

According to an exemplary embodiment of the invention, a component carrier is provided which comprises an electrically insulating layer structure having a first main surface and a second main surface, a through hole (in particular a laser through hole) extending through the electrically insulating layer structure between the first main surface and the second main surface and having a first tapering portion extending from the first main surface and a second tapering portion extending from the second main surface, a first plating structure on at least part of sidewalls of the electrically insulating layer structure, which sidewalls delimit the through hole, and a second plating structure formed separately from and arranged on the first plating structure, wherein the second plating structure comprises (as an integral part of the second plating structure) an electrically conductive bridge structure connecting the opposing sidewalls.

According to another exemplary embodiment of the invention, a meth-od of manufacturing a component carrier is provided, wherein the method comprises forming a through hole (in particular a laser through hole) ex-tending between a first main surface and a second main surface of an electrically insulating layer structure so that the through hole has a first tapering portion extending from the first main surface and a second tapering portion extending from the second main surface, carrying out a first plating procedure to thereby form a first plating structure on at least part of sidewalls of the electrically insulating layer structure, which sidewalls delimit the through hole, and subsequently carrying out a separate second plating procedure to thereby form a second plating structure on the first plating structure, wherein the second plating structure is formed with an electrically conductive bridge structure connecting the opposing sidewalls.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "layer structure" may particularly denote a continuous layer, a patterned layer or a plurality of non-consecutive islands within a common plane.

In the context of the present application, the term "through hole" may particularly denote a hole extending completely through an entire electrically insulating layer structure, and which may be formed in particular and preferably by laser processing. Thus, the through hole may be a laser through hole. Such a through hole may have, for example, two opposing tapering portions extending from the two opposing main surfaces of the electrically insulating layer structure. A through hole may be manufactured for instance by a combination of laser shots from the front side and the back side, i.e. from the two opposing main surfaces of, the electrically insulating layer structure. One or more laser shots may be performed from each of these sides. Formation of a through hole by laser processing from only one main surface may be possible as well. Furthermore, formation of a through hole may be carried out as well by other methods than laser processing, for instance by a plasma treatment.

In the context of the present application, the term "plating structure" may particularly denote a physical structure formed by plating, i.e. by a surface covering process in which a metal is deposited on a surface, in particular on an electrically conductive surface. In particular, a plating structure may be formed by electroplating. In electroplating, an ionic metal is supplied with electrons to form a non-ionic coating on an electrically conductive surface. A corresponding system may involve a chemical solution with the ionic form of the metal, an anode (i.e. a negatively charged electrode) which may correspond to the metal to be plated and a cathode (i.e. a positively charged electrode) where electrons are supplied to produce a film of non-ionic metal on the electrically conductive surface. For galvanic deposition or electroplating of a metal such as copper, water-based solutions may be used which contain the metal(s) to be deposited as ions (in particular dissolved metal salts). An electric field between an anode and a work-piece (such as the pre-form of the component carrier with the through hole having a sidewall to be covered with a plating structure) as cathode may force positively charged metal ions to move to the cathode where they give up their charge and deposit themselves as metal on the surface of the sidewall of the through hole in the electrically insulating layer structure. Electroplating or galvanic deposition processes may encompass, besides the pure metal deposition, also preparative and/or post-treatments of the preform of the component carrier to be coated.

In the context of the present application, the term "separately formed plating structures" may particularly denote physically separate and visually distinguishable plating structures being formed in different plating procedures. As known by those skilled in the art, when separate plating structures are carried out one after the other, an interface between these plating structures is visible when inspecting a cross-sectional view of the component carrier. Different plating structures may be manufactured with different plating manufacturing equipment, with different plating chemistry, and/or in different periods of time.

In the context of the present application, the term "bridge structure" may particularly denote an electrically conductive structure extending substantially horizontally between opposing sidewalls of the electrically insulating layer structure and delimiting the through hole, in particular at or close to a narrowest portion of the through hole. For instance, such a bridge structure can be formed by plating following through hole formation. After such a plating procedure, the previously formed through hole is only partially filled with electrically conductive material constituting the bridge structure, so that the bridge structure may be delimited in an upward direction by a first demarcation surface and at a lower side by a second demarcation surface. Both the first demarcation surface and the second demarcation surface may have a concave shape.

According to an exemplary embodiment of the invention, a component carrier is provided having a through hole (preferably a laser through hole) being at least partially filled with electrically conductive filling medium such as copper. In order to fill the through hole properly, i.e. without reliability issues, without the formation of cracks, without light through issues and/or without inclusions or voids in an interior of the filling medium, it has turned out to be highly advantageous to firstly form a first plating structure on the sidewalls delimiting the through hole, and to only subsequently form in a separate further plating procedure a bridge structure forming a horizontal connection between the sidewalls and being deposited on the first plating structure. It has turned out that when carrying out a double plating procedure for filling the through hole with sidewall covering layers as well as forming a horizontal bridge structure, the quality of a copper filled laser via can be significantly improved. Thus, the yield may be improved and the electrical, mechanical and thermal reliability of the component carrier may be enhanced.

In the following, further exemplary embodiments of the component carrier and the method will be explained.

In an embodiment, the first plating structure is a plating layer which covers the sidewalls with substantially homogeneous thickness. Although an absolutely identical thickness of the first plating structure on different portions of the sidewalls delimiting the laser through hole cannot always be guaranteed, a deviation between thickest and thinnest region of the first plating structure may be less than 30%, preferably less than 15%. With such a substantially homogeneous coating of the sidewalls (which delimit the laser through hole with regard to the electrically insulating layer structure) with electrically conductive material prior to bridge formation, the obtained reliability of the component carrier can be significantly improved.

It should be said that the first plating structure may be applied directly on the dielectric material of the electrically insulating layer structure defining the sidewalls. It is however also possible, and sometimes even preferable, that the first plating structure is formed on a very thin seed layer (which may be formed by electroless deposition) which may firstly be formed on the dielectric sidewall of the electrically insulating layer structure to properly prepare subsequent formation of the first plating structure (in particular by electroplating or galvanic plating). In the latter mentioned embodiment, the first plating structure on the sidewall is spaced with regard to the sidewall by the thin seed layer.

In an embodiment, a minimum horizontal thickness of the first plating structure is in a range between 3 μm and 30 μm, in particular in a range between 5 μm and 15 μm. For instance, the first plating structure with such a minimum thickness (i.e. thickness at the thinnest portion of the first plating structure in the entire laser through hole) may fill 10% to 50% of the entire width of the laser through hole. Such a relatively thick first plating structure has turned out to have a highly positive impact on reliability of the laser through hole filled with electrically conductive material.

In an embodiment, a minimum vertical thickness of the bridge structure is in a range between 10 μm and 60 μm, in particular between 20 μm and 40 μm. It has furthermore turned out that the reliability of the laser through hole filled with electrically conductive filling medium can be significantly improved when the thickness of the bridge structure in a vertical direction becomes not too small. Most preferably is a thickness of at least 20 μm. However, when the thickness of the bridge structure becomes excessive, this may have an undesired impact on the shape of dimples or recesses above and below the bridge structure in the laser through hole, so that an upper limit of 60 μm of the minimum thickness of the bridge structure (i.e. the thickness at the narrowest portion of the bridge structure) should not be exceeded.

In an embodiment, a minimum horizontal thickness of the second plating structure outside of or apart from the bridge structure may be in a range between 2 μm and 20 μm, in particular in a range between 4 μm and 10 μm. In particular, the minimum horizontal thickness of the second plating structure at a portion thereof which covers the sidewalls of the electrically insulating layer structure apart from the bridge structure may be smaller than the minimum thickness of the first plating layer. However, the minimum horizontal thickness of the second plating structure may be larger than a thickness of an optional seed layer.

In an embodiment, in a cross-sectional view in accordance with a viewing plane comprising a main extension direction of the laser through hole, the first plating structure is shaped as two angled legs. The term "viewing plane comprising a main extension direction of the laser through hole" may correspond to the paper plane of FIG. 7. Thus, the mentioned cross-sectional view corresponds to a viewing plane which includes the central axis of the through hole and one further axis perpendicular to the central axis of the through hole. In this viewing plane, the first plating structure appears as two connected straight legs with an (in particular obtuse) angle in between. In other words, the first plating structure may follow the shape of the sidewall delimiting the laser through hole and being defined by two tapering portions on opposing main surfaces of the electrically insulating layer structure.

In an embodiment, in a cross-sectional view in accordance with a viewing plane comprising a main extension direction of the laser through hole (see FIG. 7), the second plating structure is substantially H-shaped. When a second separate plating procedure is carried out after having formed the first plating procedure, this results in the formation of a substantially horizontal bridge structure but additionally also in a coverage of exposed sidewalls of the first plating structure with additional electrically conductive material of the second plating structure. As a result, the second plating procedure may result in the formation of a substantially H-shaped electrically conductive structure on the first plating structure.

In an embodiment, a thickness of the electrically insulating layer structure is not more than 100 µm, in particular is in a range between 40 µm and 60 µm. As mentioned above, the double plating architecture according to an exemplary embodiment of the invention significantly improves the reliability of the laser through hole filled with electrically conductive filling medium such as copper. It should be mentioned additionally that such reliability issues become more and more severe the thinner the electrically insulating layer structure (in particular a fully cured core) becomes. If the thickness of the electrically insulating layer structure falls below 100 µm and is in particular in a range between 40 µm and 60 µm, issues with electric reliability due to the tendency of cracks, voids or delamination become particularly pronounced. With the double plating architecture according to an exemplary embodiment of the invention, such reliability issues can be overcome or at least significantly reduced.

In an embodiment, the electrically conductive bridge structure is de-limited by a, in particular concave, first demarcation surface facing towards the first main surface and by a, in particular concave, second demarcation surface facing towards the second main surface. In many cases, the central portion of the bridge structure has the smallest thickness in a vertical direction. In this region of smallest thickness, the two demarcation surfaces have the smallest mutual distance.

In an embodiment, the component carrier comprises a first electrically conductive bulk structure filling at least part between the first demarcation surface and the first main surface. Thus, further electrically conductive filling medium may be filled into a recess or dimple above the first demarcation surface. This may further improve the electric reliability of the component carrier.

In an embodiment, the component carrier comprises a second electrically conductive bulk structure filling at least part between the second demarcation surface and the second main surface. Correspondingly, also the dimple or recess below the second demarcation surface may be filled partially or entirely with electrically conductive filling medium such as copper. Also, this filling procedure further improves the electric reliability of the component carrier.

In an embodiment, at least one of the first electrically conductive bulk structure and the second electrically conductive bulk structure is a further plating structure, i.e. is formed by a further additional separate plating procedure. The degree of filling the dimple above and/or the dimple below the respective demarcation surface of the bridge structure may be defined by the design of and by adjusting the number of further plating procedures carried out after having completed formation of the second plating structure which integrally includes the bridge structure. As known by a person skilled in the art, a cross-sectional view of the component carrier will allow to visually distinguish the various further plating structures constituting the first or second electrically conductive bulk structure.

In an embodiment, the component carrier comprises a (for instance patterned) first electrically conductive layer structure (in particular a first metal foil having a first window aligned with the first tapering portion of the through hole extending through the electrically insulating layer structure) on the first main surface and/or a (for instance patterned) second electrically conductive layer structure (in particular a second metal foil having a second window aligned with the second tapering portion of the through hole extending through the electrically insulating layer structure) on the second main surface. Thus, a respective electrically conductive layer may be attached to each of two opposing main surfaces of the electrically insulating layer structure. Preferably, the electrically conductive layer structures may be copper foils. By a first laser shot from the first main surface of the electrically insulating layer structure, a first window may be formed in the first electrically conductive layer structure. Correspondingly, a second window may be formed in the second electrically conductive layer structure by a second laser shot from the second main surface of the electrically insulating layer structure.

In another embodiment, the method comprises forming the through hole in the electrically insulating layer structure while one or both of the main surfaces of the electrically insulating layer structure is or are not covered by an electrically conductive layer structure. In such an embodiment (in which electrically conductive layer structures on one or both of the opposing main surfaces of the electrically insulating layer structure may be dispensable), the through hole may be drilled directly through the electrically insulating layer structure alone.

In an embodiment, at least a part of the laser through hole is substantially X-shaped. Correspondingly, forming the laser through hole may comprise carrying out a first laser drilling from the first main surface with one laser shot and carrying out a second laser drilling from the second main surface with only one laser shot. As also shown in FIG. 2, forming a laser through hole with a substantially X shape can be carried out by a combination of a first laser shot from the front side or first main surface of the electrically insulating layer structure, followed by a single second laser shot from the back side or second main surface of the electrically insulating layer structure. Such a procedure of manufacturing the laser through hole is very simple and fast.

In an embodiment, the laser through hole comprises a central connection portion connecting the first tapering portion with the second tapering portion, and wherein the bridge structure is at least partially located in the central connection portion. Correspondingly, forming the laser through hole may comprise carrying out a first laser drilling from the first main surface with one laser shot and carrying out a second laser drilling from the second main surface with two laser shots. As shown in FIG. 3, such a structure may be obtained by firstly carrying out a single laser shot from the front side or first main surface of the electrically insulating layer structure, followed by two subsequent laser shots from the back side or second main surface of the electrically insulating layer structure. By carrying out such a procedure for manufacturing a laser through hole, the reliability can be further improved by preventing an excessively narrow central portion of the laser through hole.

In an embodiment, the electrically insulating layer structure is a core, in particular a fully cured core. Thus, the material of the electrically insulating layer structure may be already fully cured at the time of forming the laser through hole. This means that the material of the electrically insulating layer structure may not be able to further cross-link during a subsequent lamination procedure during which further layer structures may be laminated to the front side and/or back side of the stack through which the laser through hole is formed. For instance, the core may comprise resin such as epoxy resin, and reinforcing particles, such as glass fibers or glass spheres. In particular, the core may be made of FR4 material.

In an embodiment, the component carrier comprises a seed layer directly on at least part of the sidewalls so as to be arranged or sandwiched between the electrically insulating layer structure and the first plating structure. Correspondingly, forming the first plating structure may be carried out after forming a seed layer directly on the sidewalls. Electroplating (for forming the first plating structure) may be promoted by an electrically conductive surface on which the electrically conductive material of the first plating structure is deposited. In order to cover the dielectric sidewalls of the electrically insulating layer structure with a thin metallic film on which the first plating structure can be formed by electroplating, it may be advantageous to form a seed layer of chemical copper with a small thickness. It is possible that the seed layer has a thickness above 1 μm and/or that several cumulative seed layers are provided. For example, a thickness of a seed layer or a cumulative thickness of a plurality of seed layers may be in a range between 0.5 μm and 5 μm. When multiple seed layers are provided, they may comprise an organic (for instance polymer) layer, a palladium layer, and/or a copper layer. The formation of such a seed layer can be carried out by a chemical reaction to get a conductive surface comprising preferably copper. Following this seed layer formation, the first plating structure may then be formed by galvanic plating by which a significantly thicker layer (for instance having a thickness of 15 μm, for instance of copper) may be plated in the laser through hole and on the chemical copper surface by applying current onto the component carrier to be manufactured.

In an embodiment, the component carrier comprises a patterned first electrically conductive layer structure on the first main surface and/or a patterned second electrically conductive layer structure on the second main surface. For instance, metal layers such as copper foils may be formed on both opposing main surfaces of the electrically insulating layer structure. Each of the electrically conductive layer structures may have a window in alignment with the laser through hole, wherein the laser shots from the front side and the back side can form these windows in previously continuous metal layers for forming the patterned electrically conductive layer structures.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through holes through the laminate, for instance by laser drilling or mechanical drilling, and by filling them with electrically conductive material (in particular copper), thereby forming vias as through hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as glass particles, in particular glass spheres).

In an embodiment, the at least one electrically insulating layer structure comprises at least one of the group consisting of resin (such as rein-forced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up material, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, at least one of the electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, at least one component may be surface mounted on and/or embedded in the component carrier. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration.

In an embodiment, the component carrier is a laminate-type component carrier. In such an embodiment, the component carrier is a compound of multiple layer structures which are stacked and connected together by applying a pressing force and/or heat.

The substrate or interposer may consist of at least a layer of glass, silicon (Si) or a photo-imagable or dry-etchable organic material like epoxy-based build-up materials or polymer compounds like polyimide, polybenzoxazole, or benzocyclobutene.

The aspects defined above and further aspects of embodiments of the invention are apparent from the examples of embodiment to be described hereinafter and are explained with reference to these examples of embodiment.

DETAILED DESCRIPTION OF ILLUSTRATED EMBODIMENTS

Figure 1:
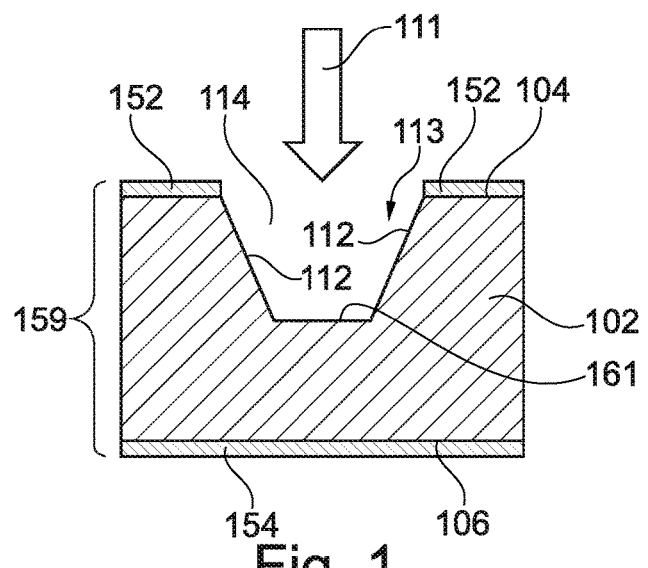
FIG. 1, FIG. 2, FIG. 3, FIG. 4, FIG. 5 and FIG. 6 illustrate cross-sectional views of structures obtained during carrying out methods of manufacturing a component carrier, shown in FIG. 7, with a laser through hole by a multiple laser shot treatment from opposing sides and by subsequently filling the laser through hole at least partially with electrically conductive filling medium according to an exemplary embodiment of the invention.

The illustrations in the drawings are schematically presented. In different drawings, similar or identical elements are provided with the same reference signs.

Before referring to the drawings, exemplary embodiments will be de-scribed in further detail, some basic considerations will be summarized based on which exemplary embodiments of the invention have been developed.

According to an exemplary embodiment of the invention, two-layer bridge plating procedures may be carried out to ensure a complete and reliable bridging in a narrowest region of a laser through hole. At the same time, a high or even maximum capacity may be ensured with such a manufacturing procedure.

When forming laser through holes with very thin electrically insulating layer structure (such as a core having a thickness of not more than 60 μm or even not more than 50 μm), filling the laser through hole with electrically conductive filling medium (such as copper) is critical. In particular in the region of the narrowest portion of the laser through hole, a reliable filling with such electrically conductive filling medium may be problematic, since formation of a bridge connecting opposing sidewalls in such a narrowest region is difficult. At the same time, a huge number of laser through holes has to be formed in component carrier technology, for instance more than 100,000 laser through holes per panel.

Surprisingly, it has turned out that two-layer plating is particularly advantageous for reliably filling the laser through hole without the formation of voids or cracks in the electrically conductive filling medium. In particular, a reliable formation of a substantially horizontal bridge structure can be efficiently promoted by two-layer plating. This allows ensuring good bridge formation and sufficient capacity. Exemplary embodiments of the invention may thus provide an easy laser through hole bridging process.

Figure 5:
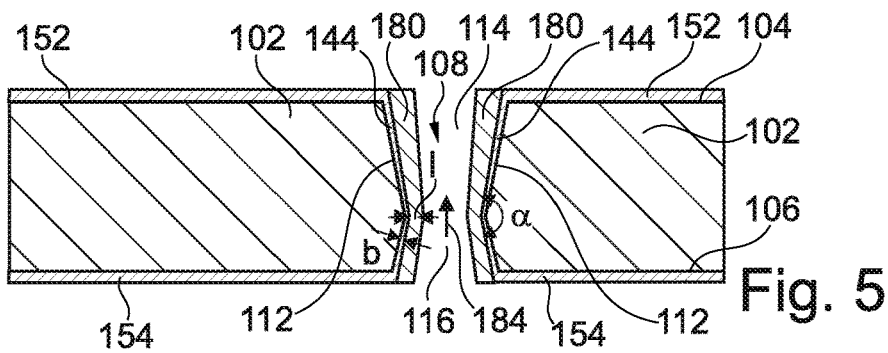
Figure 6:
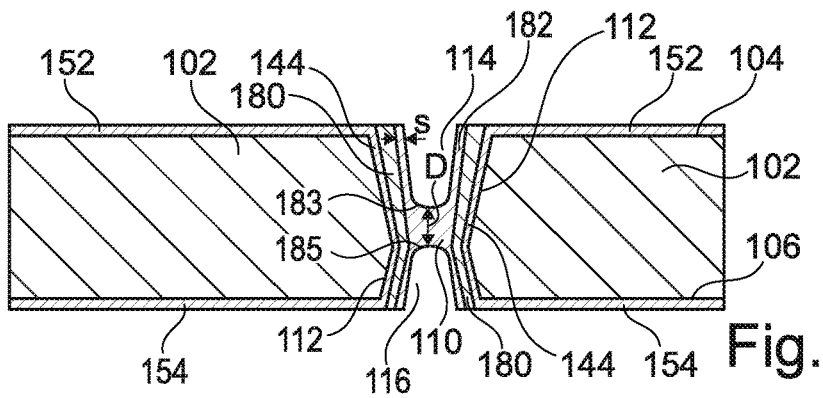
Figure 7:
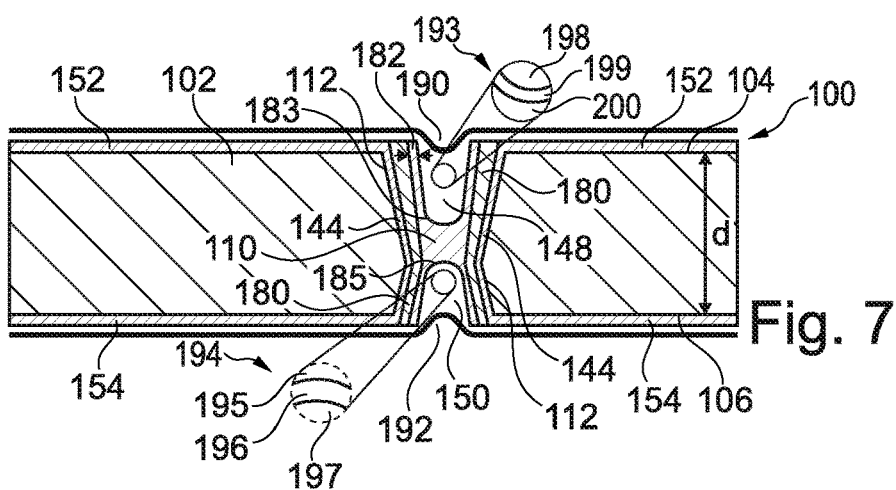

FIG. 1 to FIG. 7 illustrate cross-sectional views of structures obtained during carrying out a method of manufacturing a component carrier 100, shown in FIG. 7. This manufacturing procedure involves the formation of a laser through hole 108 by a multiple laser shot treatment from opposing sides (compare FIG. 1 to FIG. 4). Subsequently, such a laser through hole 108 may be filled partially or entirely with an electrically conductive filling medium, such as copper, by carrying out multiple plating procedures according to an exemplary embodiment of the invention (compare FIG. 5 to FIG. 7).

As shown in FIG. 1, starting point of the manufacturing method is a stack 159 comprising a first electrically conductive layer structure 152 on a first main surface 104 of an electrically insulating layer structure 102. The stack 159 furthermore comprises a second electrically conductive layer structure 154 on a second main surface 106 of the electrically insulating layer structure 102.

In order to obtain the layer structure shown in FIG. 1, the front side or first main surface 104 of the electrically insulating layer structure 102 covered with the first electrically conductive layer structure 152 may be made subject of a first laser treatment. For this purpose, a first laser shot 111 can be carried out to form a through hole or window in the first electrically conductive layer structure 152 and a blind hole 113 in the electrically insulating layer structure 102. The blind hole 113 is delimited by sidewalls 112 and a bottom wall 161 of the electrically insulating layer structure 102.

Care should be taken that the laser energy and duration during the first shot 111 is not excessive so that the blind hole 113 does not reach up to the second electrically conductive layer structure 154. Otherwise, undesired effects such as a reflection of laser light, etc. may occur. Descriptively speaking, the blind hole 113 may later form a first tapering portion 114 of the laser through hole 108 shown in FIG. 2 or FIG. 3.

Figure 2:
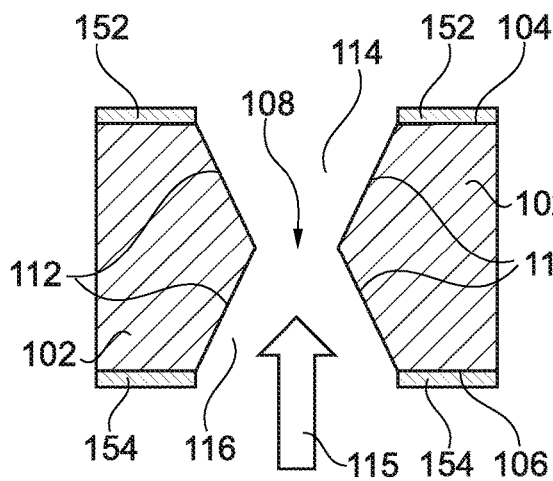

Referring to FIG. 2, formation of the laser through hole 108 may be completed by carrying out, after the first laser drilling from the first main surface 104 with one laser shot according to FIG. 1, a second laser drilling from the second main surface 106 with one laser shot. As a result of this back side laser drilling, a through hole or window is formed in the second electrically conductive layer structure 154, and the blind hole 113 is extend-ed until it forms laser through hole 108 extending between first main surface 104 and second main surface 106 of the electrically insulating layer structure 102. As shown in FIG. 2, the laser through hole 108 has first tapering portion 114 extending from the first main surface 104 and has second tapering portion 116 extending from the second main surface 106. The first tapering portion 114 and the second tapering portion 116 meet each at a narrowest portion in the center of the laser through hole 108.

In order to obtain the structure shown in FIG. 2, the structure obtained after carrying out the procedure described referring to FIG. 1 may be made subject to a second laser shot 115 from the back side or second main surface 106 of the electrically insulating layer structure 102. As a result, a through hole is formed through the second electrically conductive layer structure 154 and additional material of the electrically insulating layer structure 102 is removed by the laser energy until the previously formed blind hole 113 is extended from the bottom side into laser through hole 108. This laser through hole 108 according to FIG. 2 has a substantially X shape and can be directly subsequently made subject to a procedure of being filled with electrically conductive filling medium such as copper (see FIG. 4 to FIG. 7). Formation of the laser through hole 108 according to FIG. 2 is highly efficient and is therefore particularly appropriate for processing on industrial scale, since it may be sufficient to use only two laser shots for its formation.

Alternatively, it is possible to carry out a further laser drilling procedure from the backside before filling the laser through hole 108 with electrically conductive filling medium such as copper. The latter mentioned embodiment will now be described referring to FIG. 3.

Figure 3:
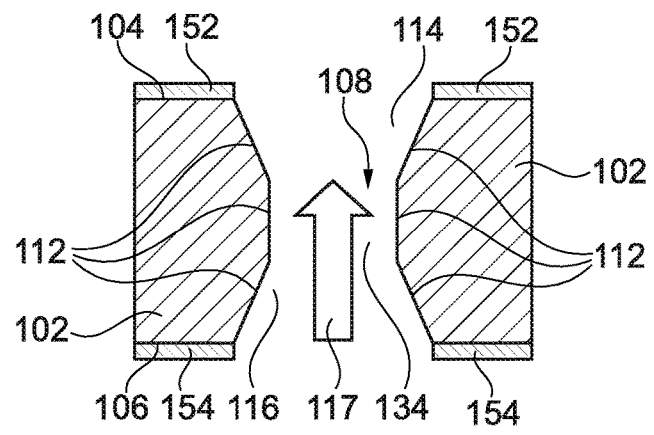

Referring to FIG. 3, the shape of the laser through hole 108 is modified in particular in the central portion thereof by carrying out, after the first laser drilling from the first main surface 104 with one laser shot according to FIG. 1 and after carrying out the second laser drilling from the second main surface 106 according to FIG. 2, a third laser shot from the backside.

Hence, alternatively to the procedure described referring to FIG. 2, it is also possible to carry out an additional third laser shot 117 from the back side or second main surface 106 of the electrically insulating layer structure 102 to refine the shape of the laser through hole 108. Such a third laser shot 117 may remove material in the central portion of the electrically insulating layer structure 102 so as to form a substantially cylindrical central portion 134 sandwiched between the two tapering portions 114, 116. Although the manufacturing procedure for forming the laser through hole 108 with the shape according to FIG. 3 requires an additional third laser shot 117 compared to FIG. 2, this shape may further improve the reliability of the manufactured component carrier 100.

A laser through hole filling procedure according to an exemplary embodiment of the invention will be described in the following referring to FIG. 4 to FIG. 7 and is based on a geometry of the laser through hole 108 of the type as shown in FIG. 2. A skilled person will understand that it is alternatively also possible according to another exemplary embodiment of the invention to initiate filling of the laser through hole 108 based on a geometry as shown in FIG. 3.

Figure 4:
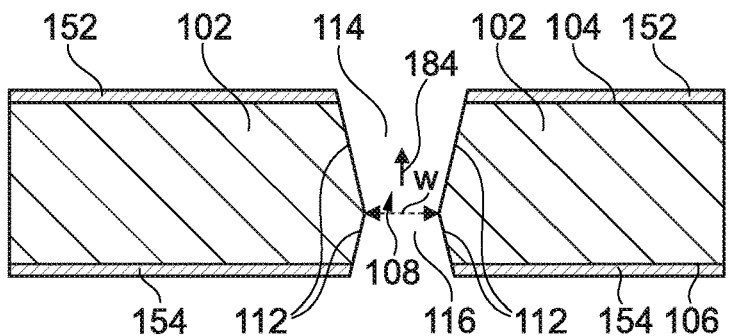

As shown in FIG. 4, depending on the parameters of the first and second laser shots 111, 115, the narrowest portion with horizontal width w of the laser through hole 108 may be shifted in a vertical direction. According to FIG. 4, the position of the smallest width w is below a vertically central position of the electrically insulating layer structure 102. As also shown in FIG. 4, a main extension direction 184 of the laser through hole 108 is vertical.

Referring to FIG. 5, a thin seed layer 144 (in particular made of copper) is firstly formed directly on the dielectric sidewalls 112 of the electrically insulating layer structure 102, for instance by electroless deposition. Subsequently, a first electroplating procedure may be carried out to thereby form a first plating structure 180 on the seed layer 144 on sidewalls 112 of the electrically insulating layer structure 102. Thus, the first plating structure 180 (which may also be denoted as first electroplating structure) is formed on the seed layer 144 and may be made as well of copper. For instance, the first electroplating procedure may be a galvanic plating procedure.

Descriptively speaking, the structure shown in FIG. 5 is obtained by firstly carrying out an electroless deposition procedure for forming the seed layer 144 of chemical copper. A thickness b of the seed layer 144 may be for instance 0.5 μm. The chemical copper of the seed layer 144 may be formed by a chemical reaction to obtain an electrically conductive surface on the sidewalls 112 for promoting subsequent formation of the first plating structure 180. Optionally, the procedure of forming the seed layer 144 may be carried out after a previous desmearing procedure during which the laser through hole 108 may be cleaned and the resin thereof may be swelled to obtain an improved surface roughness. Such a procedure may further improve the reliability of the manufactured copper filled laser via.

After having formed the seed layer 144, the mentioned first galvanic plating or electroplating procedure may be carried out for forming the first plating structure 180. For this purpose, a current may be applied to the electrically conductive seed layer 144. The preform of the component carrier shown in FIG. 5 may be, during this galvanic plating procedure, immersed in a bath with a copper source. Due to the electric current applied between cathode and anode, metallic copper will deposit on the seed layer 144, thereby forming the first plating structure 180.

The first plating structure 180 is here embodied as a plating layer which covers the seed layer 144 on the sidewalls 112 with substantially homogeneous thickness I (see FIG. 5). A minimum value of the horizontal thickness I of the first plating structure 180 may be 10 μm. In the cross-sectional view of FIG. 5, i.e. in accordance with a viewing plane comprising main extension direction 184 of the laser through hole 108, the first plating structure 180 is shaped as two angled legs on the left-hand side and on the right-hand side, wherein an angle α between the legs is here obtuse.

Referring to FIG. 6, a separate second electroplating procedure may be subsequently carried out (i.e. after the first electroplating procedure for forming the first plating structure 180) to thereby form a second plating structure 182 (which may also be denoted as second electroplating structure) on the first plating structure 180. As shown, the second plating structure 182 is formed which comprises an electrically conductive bridge structure 110 connecting the opposing sidewalls 112. In other words, the bridge structure 110 forms an integral part of the second plating structure 182, together with slanted legs of the second plating structure 182 being integrally connected with the bridge structure 110. The slanted legs of the second plating structure 182 are formed on the slanted legs of the first plating structure 180. More specifically, the second plating structure 182 is substantially H-shaped and covers lateral sidewalls of the first plating structure 180 and forms the substantially horizontal bridge structure 110. A minimum thickness D of the bridge structure 110 may be 25 μm. A minimum horizontal thickness s of vertical or slanted legs of the second plating structure 182 may be 8 μm. In the cross-sectional view of FIG. 6, the second plating structure 182 is substantially H-shaped.

Thus, after having obtained the structure shown in FIG. 5, a separate further plating procedure of the same or different kind may be carried out, for instance galvanic plating. By taking this measure, the second plating structure 182 is obtained, for instance by galvanic deposition or electroplating. It has turned out that adding the separate procedure of forming the first plating structure 180 prior to the formation of the second plating structure 182 including bridge structure 110, the reliability of the obtained component carrier 100 can be improved.

Still referring to FIG. 6, the geometry of the through hole 108 may result, when carrying out a plating process, in the formation of bridge structure 110 laterally connecting opposing sidewalls 112 of the electrically insulating layer structure 102 delimiting the through hole 108 at a vertical level at which the distance to the first main surface 104 is different from the distance to the second main surface 106. This may promote the formation of a free hanging, asymmetrical bridge structure 110 located out of a vertical center of the through hole 108.

Referring to FIG. 7, the method comprises forming a first electrically conductive bulk structure 148 filling a recess above the bridge structure 110. Moreover, the method comprises forming a second electrically conductive bulk structure 150 filling a recess below the bridge structure 110. The first electrically conductive bulk structure 148 and the second electrically conductive bulk structure 150 may be formed by a further electroplating procedure (in particular a further galvanic plating procedure) following the second electroplating procedure of forming the bridge structure 110. As shown in FIG. 6 and FIG. 7, the electrically conductive bridge structure 110 is formed to be delimited by an upper first demarcation surface 183 oriented upwardly or facing towards the first main surface 104 and by a lower second demarcation surface 185 orientated downwardly or facing towards the second main surface 106.

In the shown embodiment, a small dip 190, 192, respectively, remains at an upper side or a lower side of the shown component carrier 100. In other embodiments, the bulk structures 148, 150 fill the remaining recesses above the first demarcation surface 183 and below the second demarcation surface 185 almost completely. It should be said that it is well-known by a skilled person that the demarcation surfaces 183, 185 are clearly visible when imaging a cross-section of the component carrier 100.

As a result of the described manufacturing method, the shown component carrier 100 according to an exemplary embodiment of the invention is obtained. A vertical thickness d of the electrically insulating layer structure 102 may be 60 μm.

With yet another single or multiple plating procedure, for instance by carrying out further galvanic plating procedures/electrodeposition procedures, the remaining recesses above the first demarcation surface 183 and below the second demarcation surface 185 may be partially or entirely filled. FIG. 7 shows a partial filling by which the small dips 190, 192 occur in the laser through hole 108 which remain unfilled with electrically conductive filling medium. As can be seen in a detail 194, the electrically conductive bulk structure 150 may be composed of separate plating layers 195, 196, 197 which may be manufactured in separate procedures. In a corresponding way, detail 193 shows that the electrically conductive bulk structure 148 can also be composed of multiple separate plating layers 198, 199, 200 formed in subsequent plating procedures.

Figure 2A:
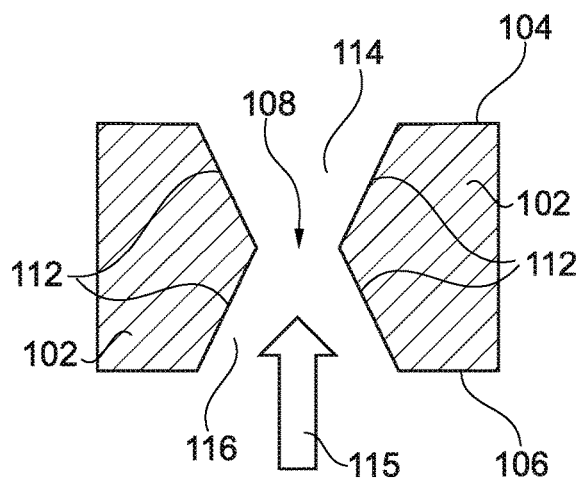
FIG. 2A shows a cross-sectional view of a preform of a component carrier according to another exemplary embodiment relating to FIG. 2 but with the difference that no electrically conductive layer structures are provided on the opposing main surfaces of the electrically insulating layer structure at the time of forming the through hole.

FIG. 2A shows a cross-sectional view of a preform of a component carrier 100 according to another exemplary embodiment relating to FIG. 2 but with the difference that no electrically conductive layer structures 152, 154 are provided on the opposing main surfaces 104, 106 of the electrically insulating layer structure 102 at the time of forming the through hole 108.

A main difference between the embodiment of FIG. 1 to FIG. 7 and the embodiment of FIG. 2A is that, according to FIG. 2A, the main surfaces 104, 106 of the electrically insulating layer structure 102 have not been covered by electrically conductive layer structures 152, 154 at the time of forming the through hole 108. Thus, the manufacturing method relating to the embodiment of FIG. 2A comprises forming the through hole 108 in the electrically insulating layer structure 102 while the main surfaces 104, 106 of the electrically insulating layer structure 102 have not been covered by an electrically conductive layer structure 152, 154 such as a copper foil.

What concerns the subsequent filling of the through hole 108 and coverage of the main surfaces 104, 106 with an electrically conductive filling medium, this may be carried out by the formation of an optional seed layer 144, the subsequent formation of a first plating structure 180 covering at least part of the main surfaces 104, 106 and of the sidewalls 112 of the through hole 108, the subsequent formation of a second plating structure 182 covering the first plating structure 180 and the formation of a bridge structure 110 bridging opposing sidewalls 112 and having for instance a substantially H-shape together with the second plating structure 182. An optional filling of one or both volumes above and/or below the bridge structure 110 by one or more bulk structures 148, 150 (which may be further plating structures or sequences of plating structures) is possible as well. Reference is made to the corresponding description of FIG. 5 to FIG. 7.

Apart from this difference, the above disclosure concerning FIG. 1 to FIG. 7 also applies to FIG. 2A. Also, through hole formation according to FIG. 3 can be carried out without copper foils on the electrically insulating layer structure 102.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
   an electrically insulating layer structure having a first main surface and a second main surface;
   a through hole extending through the electrically insulating layer structure between the first main surface and the second main surface and having a first tapering portion extending from the first main surface and a second tapering portion extending from the second main surface;
   a first plating structure on at least part of a sidewall of the electrically insulating layer structure, which sidewall delimits the through hole;
   a seed layer directly on at least a part of the sidewall which is arranged between the electrically insulating layer structure and the first plating structure; and
   a second plating structure formed separately from and arranged on the first plating structure, wherein the second plating structure is made of one piece and integrally includes an electrically conductive bridge structure connecting opposing portions of the sidewall;
   wherein the electrically conductive bridge structure is delimited by a concave first demarcation surface facing towards the first main surface and by a concave second demarcation surface facing towards the second main surface.

2. The component carrier according to claim 1, comprising at least one of the following features:
   wherein the first plating structure is a plating layer which covers the sidewalls with substantially homogeneous thickness;
   wherein a minimum horizontal thickness of the first plating structure is in a range between 3 µm and 30 µm;
   wherein a minimum vertical thickness of the bridge structure of the second plating structure is in a range between 10 µm and 60 µm;
   wherein a minimum horizontal thickness of the second plating structure apart from the bridge structure is in a range between 2 µm and 20 µm;
   wherein, in a cross-sectional view in accordance with a viewing plane comprising a main extension direction of the through hole, the first plating structure is shaped as two angled legs;
   wherein, in a cross-sectional view in accordance with a viewing plane comprising a main extension direction of the through hole, the second plating structure is substantially H-shaped;
   wherein a vertical thickness of the electrically insulating layer structure is not more than 100 µm.

3. The component carrier according to claim 1, further comprising:
   a first electrically conductive bulk structure filling at least part of a volume above the first demarcation surface; and/or
   a second electrically conductive bulk structure filling at least part of a volume below the second demarcation surface.

4. The component carrier according to claim 3, wherein at least one of the first electrically conductive bulk structure and the second electrically conductive bulk structure is a further plating structure composed of one or more further plating layers.

5. The component carrier according to claim 1, comprising at least one of the following features:
   wherein the bridge structure is at least partially located in a narrowest portion of the through hole;
   wherein the electrically insulating layer structure is a fully cured core.

6. The component carrier according to claim 1, further comprising:
   a patterned first electrically conductive layer structure on the first main surface; and/or
   a patterned second electrically conductive layer structure on the second main surface.

7. The component carrier according to claim 1, wherein at least a part of the through hole is substantially X-shaped.

8. The component carrier according to claim 1, wherein at least a part of the through hole has a central substantially cylindrical portion between the two opposing tapering portions.

9. The component carrier according to claim 1, comprising at least one of the following features:
   the component carrier comprises at least one component embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
   wherein at least one electrically conductive layer structure of the component carrier comprises at least one of a group consisting of copper, aluminum, nickel, silver, gold, palladium, and tungsten;
   wherein the electrically insulating layer structure comprises at least one of a group consisting of reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;
   wherein the component carrier is shaped as a plate;
   wherein the component carrier is configured as one of a group consisting of a printed circuit board, and a substrate;
   wherein the component carrier is configured as a laminate-type component carrier.

10. A method of manufacturing a component carrier, comprising:
    forming a through hole delimited by a sidewall extending between a first main surface and a second main surface of an electrically insulating layer structure so that the through hole has a first tapering portion extending from the first main surface and a second tapering portion extending from the second main surface;

forming a seed layer directly on the sidewall;

carrying out a first plating procedure to thereby form a first plating structure on the seed layer on at least part of the sidewall of the electrically insulating layer structure, which sidewall delimits the through hole, subsequently carrying out a separate second plating procedure to thereby form a second plating structure which is made of one piece on the first plating structure, wherein the second plating structure is integrally formed with an electrically conductive bridge structure connecting the opposing portions of the sidewall;

wherein the electrically conductive bridge structure is delimited by a concave first demarcation surface facing towards the first main surface and by a concave second demarcation surface facing towards the second main surface.

11. The method according to claim 10, wherein forming the through hole comprises carrying out a first laser drilling from the first main surface with one laser shot and carrying out a second laser drilling from the second main surface with only one further laser shot.

12. The method according to claim 10, wherein forming the through hole comprises carrying out a first laser drilling from the first main surface with one laser shot and carrying out a second laser drilling from the second main surface with two further laser shots.

13. The method according to claim 10, wherein the method comprises forming the seed layer by electroless deposition.

14. The method according to claim 10, further comprising:

forming a first electrically conductive bulk structure filling at least part of a recess between the bridge structure and the first main surface and/or a second electrically conductive bulk structure filling at least part of a recess between the bridge structure and the second main surface.

15. The method according to claim 14, further comprising:

forming at least one of a group consisting of the first electrically conductive bulk structure and the second electrically conductive bulk structure by at least one further plating procedure following the second plating procedure of forming the bridge structure.

16. The method according to claim 15, wherein at least one of the first plating procedure, the second plating procedure, and the at least one further plating procedure is configured as a galvanic plating procedure.

17. The method according to claim 10, further comprising:

before forming the through hole:

providing a first electrically conductive layer structure on the first main surface; and/or providing a second electrically conductive layer structure on the second main surface.

18. The method according to claim 10, wherein forming the through hole in the electrically insulating layer structure while one or both of the main surfaces of the electrically insulating layer structure is covered by an electrically conductive layer structure.

19. A component carrier, comprising:

an electrically insulating layer structure having a first main surface and a second main surface;

a through hole extending through the electrically insulating layer structure between the first main surface and the second main surface and having a first tapering portion extending from the first main surface and a second tapering portion extending from the second main surface;

a seed layer directly on at least a part of the through hole in the electrically insulating layer structure;

a first plating structure on at least part of the seed layer;

a second plating structure formed separately from and arranged on the first plating structure, wherein the second plating structure is made of one piece and integrally includes an electrically conductive bridge structure connecting opposing portions of a sidewall delimiting the through hole, the second plating structure having opposed concave surfaces that face main surfaces of the component carrier;

wherein at least a part of the through hole has a central substantially cylindrical portion between the two opposing tapering portions.

* * * * *